(12) United States Patent
Kalhoff et al.

(10) Patent No.: US 9,074,915 B2
(45) Date of Patent: Jul. 7, 2015

(54) PHOTOVOLTAIC SYSTEM HAVING MODULE MONITORING (75) Inventors: Johannes Kalhoff, Blomberg (DE); Thorsten Temme, Hannover (DE); Roland Bent, Detmold (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 559 days.

(21) Appl. No.: 13/144,356

(22) PCT Filed: Dec. 18, 2009

(86) PCT No.: PCT/EP2009/009136
§ 371 (c)(1),
(2), (4) Date: Sep. 30, 2011

(87) PCT Pub. No.: WO2010/081524
PCT Pub. Date: Jul. 22, 2010

(65) Prior Publication Data
US 2012/0133208 A1 May 31, 2012

(30) Foreign Application Priority Data

Jan. 16, 2009 (DE) .......................... 10 2009 005 327
Jun. 19, 2009 (DE) .......................... 10 2009 029 934

(51) Int. Cl.
*H02J 1/00* (2006.01)
*H02J 3/00* (2006.01)
(Continued)

(52) U.S. Cl.
CPC . *G01D 21/00* (2013.01); *F41B 6/00* (2013.01); *G05F 1/62* (2013.01); *H02J 7/0024* (2013.01);
(Continued)

(58) Field of Classification Search
CPC ............. H02J 7/0024; H02J 7/35; H02J 3/38; H02J 1/00; H02J 3/00; F41B 6/00; Y02T 10/7055; H01L 31/042; H01L 31/18; H01L 31/05; H02M 7/44; H05K 7/20
USPC ........ 307/31, 43, 38, 51, 87, 32, 52; 361/186, 361/187; 363/34, 42, 47, 97, 441; 438/66, 438/57, 64, 73, 80; 136/244
See application file for complete search history.

(56) References Cited

U.S. PATENT DOCUMENTS 5,972,732 A * 10/1999 Gee et al. ......................... 438/66
6,429,546 B1 * 8/2002 Ropp et al. ...................... 307/31
(Continued)

FOREIGN PATENT DOCUMENTS

DE 19613557 4/1996
DE 102008014574 A1 9/2009
(Continued)

OTHER PUBLICATIONS

Yeong-Chau Kuo et. al. Novel Maximum-Power-Point-Tracking Controller for Photovoltaic Energy Conversion System, IEEE Transactions on Industrial Electronics, vol. 48, No. 3, Jun. 2001.*
(Continued)

*Primary Examiner* — Rexford Barnie
*Assistant Examiner* — Jagdeep Dhillon
(74) *Attorney, Agent, or Firm* — Reising Ethington PC (57) ABSTRACT

The invention concerns a PV system in which a multitude of PV modules are interconnected to PV generators. Each of the PV modules comprises a network interface for transmitting module-specific data to a control device and analyzing the same. The data network is designed as a self-organizing network, in particular as a self-organizing meshed radio network.

24 Claims, 5 Drawing Sheets

(51) Int. Cl.
*G01D 21/00* (2006.01)
*G01D 4/00* (2006.01)
*H01L 31/02* (2006.01)
*F41B 6/00* (2006.01)
*G05F 1/62* (2006.01)
*H02J 7/00* (2006.01)
*H02J 7/35* (2006.01)
*G06F 15/00* (2006.01)
*H04W 84/18* (2009.01)
*H02S 50/10* (2014.01)

(52) U.S. Cl.
CPC ............... *H02J 7/35* (2013.01); *Y02T 10/7055* (2013.01); *G06F 15/00* (2013.01); *G01D 4/002* (2013.01); *H01L 31/02021* (2013.01); *H04W 84/18* (2013.01); *Y02E 10/50* (2013.01); *Y02B 70/346* (2013.01); *Y02B 90/241* (2013.01); *Y02B 90/246* (2013.01); *Y04S 20/32* (2013.01); *Y04S 20/42* (2013.01); *Y04S 20/525* (2013.01); *H02S 50/10* (2014.12)

(56) References Cited

U.S. PATENT DOCUMENTS

| | | | |
|---|---|---|---|
| 7,287,999 B2 | 10/2007 | Holterhoff et al. | |
| 7,815,463 B2 | 10/2010 | Gerberding | |
| 8,138,631 B2* | 3/2012 | Allen et al. | 307/82 |
| 8,300,439 B2* | 10/2012 | Little et al. | 363/71 |
| 8,473,250 B2* | 6/2013 | Adest et al. | 702/182 |
| 2009/0242011 A1* | 10/2009 | Proisy et al. | 136/244 |
| 2011/0318975 A1 | 12/2011 | Giefers et al. | |

FOREIGN PATENT DOCUMENTS

| | | | |
|---|---|---|---|
| WO | 03036762 A2 | 5/2003 | |
| WO | WO 2007/132473 A1 | 11/2007 | |
| WO | WO 2008/012041 A1 | 1/2008 | |

OTHER PUBLICATIONS

IEEE Transsactions on Industrial Electronics vol. 48 No. 3, Jume 2001 Novel Maximum-Power Point Tracking Controller for Photovoltaic Energy Conversion System by Yeoung-Chau Kuo-Tsorng-Juu Liang.*
Self-Organization in Communication Networks: IEEE Communication Magazine, Jul. 2005.*
Self-Organiziation in Communication Network: IEEE Communication Magazine, Jul. 2005.*
English Search Report, International Application No. PCT/EP2009/009136, International Filing Date Dec. 18, 2009, Date of Mailing Dec. 11, 2010, 2 pages.
German Search Report and Written Opinion-International Application No. PCT/EP2009/009136, Mitteilung Uber Die Ubermittilung Des Internationalen Recherchenberichts . . . , 12 pgs.
China Office Action, Dated Nov. 13, 2013, Application No. 200980154605.3, Applicant: Phoenix Contact GmbH & Co. KG, Title: Photovoltaic System Having Module Monitoring.

* cited by examiner

PHOTOVOLTAIC SYSTEM HAVING MODULE MONITORING

FIELD OF INVENTION

The invention concerns a photovoltaic system with a monitoring system for the photovoltaic modules, wherein the photovoltaic modules are individually networked with a communication network in order to monitor the photovoltaic modules on a module-specific basis.

BACKGROUND OF THE INVENTION

In a typical photovoltaic system (subsequently "photovoltaic" will be abbreviated with "PV", as is customary among experts), several PV modules are connected in series to form a PV string, in order to achieve a direct current voltage of several 100 to 1000 volts, in the future possibly even up to 1500 volts, that is appropriate for DC-AC conversion and subsequent network supply. Either the PV string is connected directly to a PV inverted rectifier (string inverter), or several strings having preferably the same structure and being exposed to similar irradiation conditions are connected in parallel and connected to a central inverted rectifier (central inverter). In order to reduce the wiring expenditure, the parallel circuit consisting of several strings can be combined to a PV sub-system, also called PV array, in a PV array combiner box (also called PV array box or PV string combiner). These, in turn, can be combined in PV generator combiner boxes which are finally connected to a central inverter, resulting in a tree structure in the power wiring.

Figure 1:
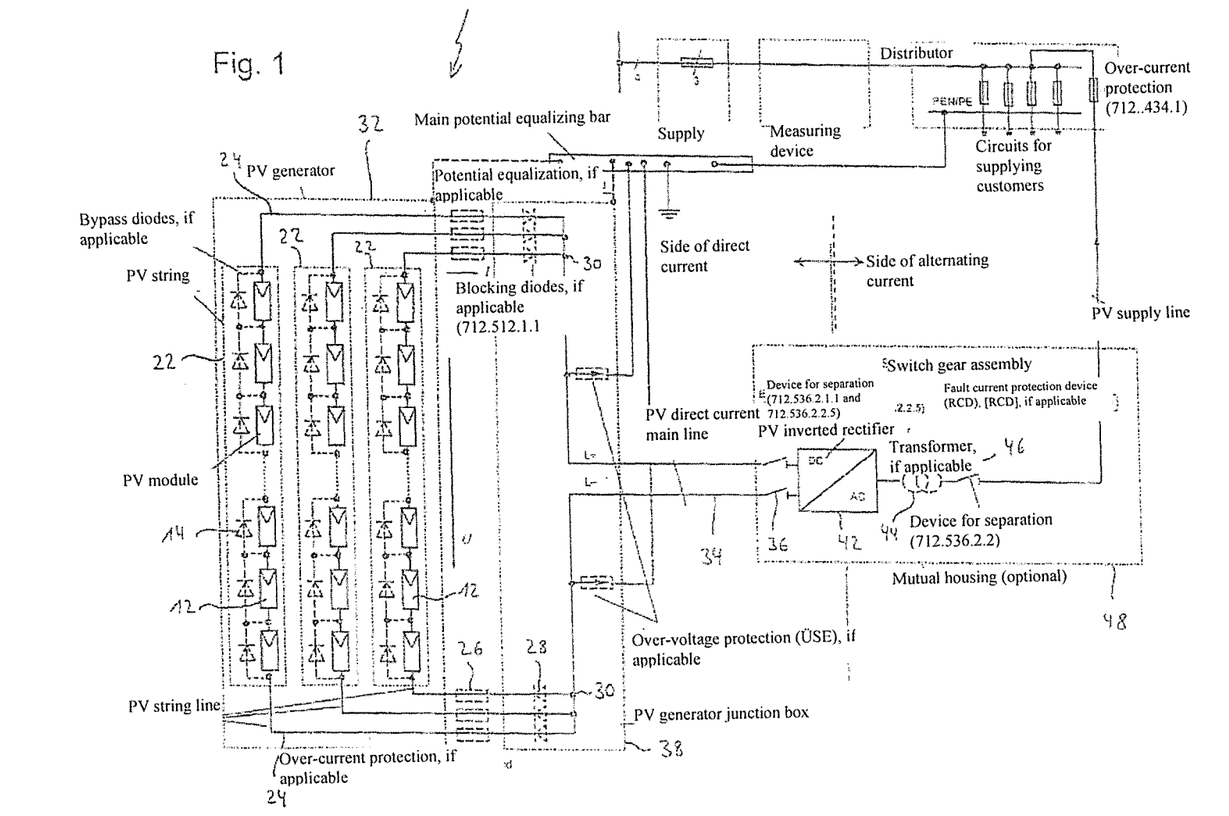
FIG. 1 a customary PV system with a one-PV-power supply system according to DIN VDE 0100-712 (VDE 0100-712): 2006-06, FIG. 2 a customary PV system with several PV arrays according to DIN VDE 0100-712 (VDE 0100-712): 2006-06, FIG. 3 an exemplary structural design of a PV system with a performance of 2.5 $MW_P$, FIG. 4 a multitude of PV modules which are connected with one another via a meshed network, FIG. 5 the PV modules shown in FIG. 4 with PV module positions determined from the radio signals, FIG. 6 same as FIG. 5 with the assignment of the PV modules matched to the layout model of the PV system, FIG. 7 a diagram of a data frame for transmitting the at least one recorded power variable to the network coordinator and FIG. 8 a device for measuring the PV module voltage by means of a field strength dependent capacitor.
Figure 2:
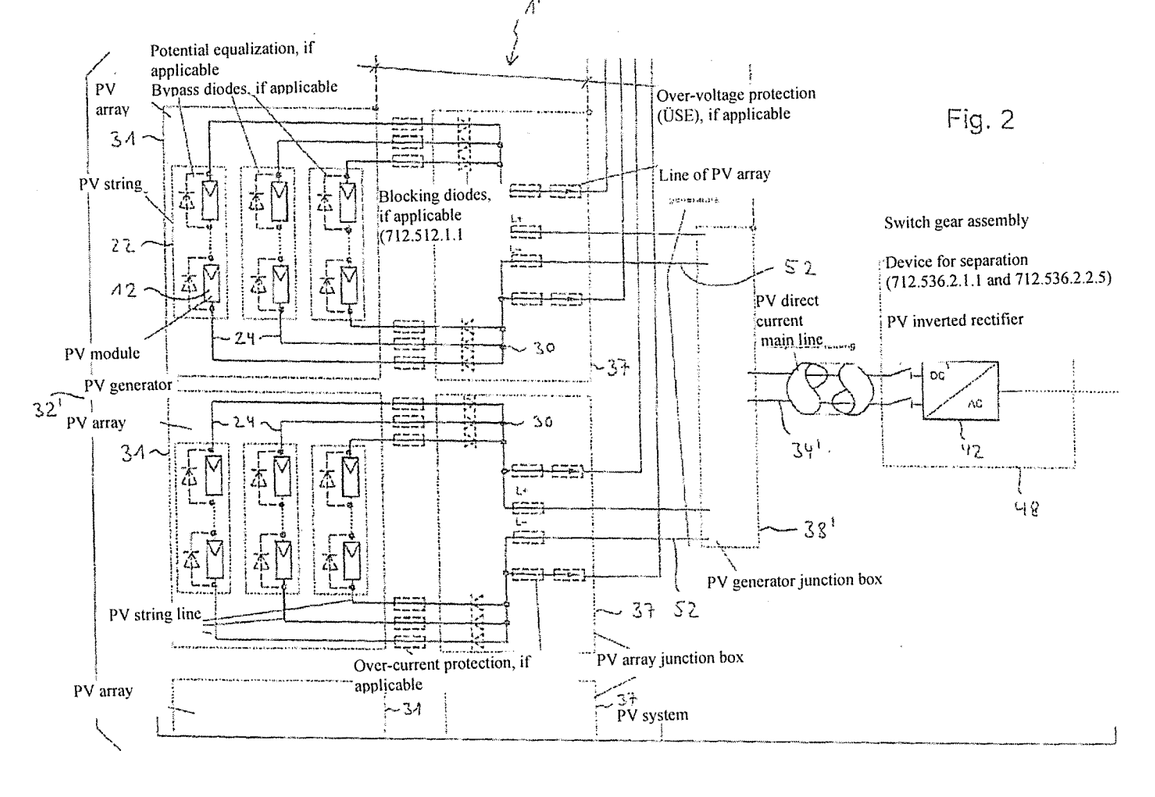

FIG. 1 shows a PV system in the form of a one-PV power supply system according to DIN VDE 0100-712 (VDE 0100-712): 2006-06, image 712.1. It involves a PV system with only one PV generator. FIG. 2 shows a PV system according to DIN VDE 0100-712 (VDE 0100-712): 2006-06, image 712.2 with several PV arrays. Subsequently, its structure is described in more detail in the detailed description, whereas the basic structure is well-known among experts. The terminology used in this application corresponds to DIN VDE 0100-712 (VDE 0100-712): 2006-06, which is well-known among experts. However, for the sake of completeness, by reference the document is made subject of the present disclosure.

Increasing interconnection of the PV system reduces the possibilities of selectively recording and analyzing the operating data of sections of the PV system located upstream of the previously mentioned tree structure and, if required, taking steps for maintaining or optimizing the system.

One possibility for system control is that of integrating sensors in the PV array box (or PV string combiner). To this end, the voltage between the positive and negative pole, which is the same for each string, and selectively the currents of the individual strings are measured. As a result, it is possible to compare the power supplied from the individual strings—in this case, the measured values represent the average values of the superior string or in general the system part which is superior to the point of measurement and allow at best to a limited extent for a comparison of individual modules in the tree structure. PowerWiring interruptions and total failure of individual modules can be detected to some extent. However, if power losses occur in several modules assigned to different strings, for example, through several partially shaded strings or prematurely aging of individual modules, the possibility for detecting errors decreases because of a lack of reference values. Adjustments of string performance by means of reference points can improve the situation only to a limited extent because they are not exposed to the same ambient conditions, for example, temperature or wind.

The DE 40 32 459 C2 proposes to equip each module with an integrated inverted rectifier with MPP tracking. Typically, an MPP tracker adjusts the voltage to the point where the system operates at maximum power (maximum power point, MPP). For this purpose, the MPP tracker varies the current extracted by a small amount, calculates the power and adjusts the current value toward a higher output. By means of a control unit, signals are transmitted to a data bus which supplies these data to the power and control unit for the purpose of examining the functional capability of the module. This system has the disadvantage that it requires a multitude of inverted rectifiers with MPP trackers and has a rigid structure of data transmission.

The DE 102 22 621 A1 discloses a solar generator with a variable current bypass which is controlled in such a way that each generator is operated continuously in its respective actual, specific MPP. This does not allow for a complex system control. The DE 20 2007 011 806 U1 discloses a solar cell system with identification chips in which an individual identification code is stored for each solar cell.

The identification chips of the solar cells are connected with a central processor via a two-wire parallel bus and an interface circuit. The central processor comprises a processor memory in which all identification codes of the solar cell system are stored. The data is transmitted with identification numbers. Also this system has the disadvantage of having a rigid structure of data transmission and requiring an individualization of the solar cells.

The DE 20 2005 020 161 U1 proposes a device for monitoring photovoltaic panels in which in the dark residual voltage is collected in the generator combiner box and the measured values are supplied to a window comparator. The inverted rectifier has been provided with a central alarm device which has a decoder for giving a panel-related alarm when falling below a specific signal threshold.

Furthermore, the DE 198 59 732 A1 describes the transmission of information from the inverted rectifier to a center by time-division multiplexing transmitting the power via the power supply line. Unfortunately, this requires a disconnection from the supply line when the data are to be transmitted.

In each of the systems mentioned above the rigid structure of data transmission, the low flexibility, as well as the susceptibility to malfunction are of disadvantage, especially in large PV systems.

GENERAL DESCRIPTION OF THE INVENTION

It is one of the objectives of the present invention to provide a PV system which allows for a flexible, interference-resistant and multifunctional control of each individual PV module wherein, from the production side, the individual PV modules do not need to be distinguishable.

It is a further objective of the invention to provide a PV system which is easy and uncomplicated to assemble and connect wherein the assembler is able to install each PV module at any position of the PV generator without having to consider a specific network structure or identification of the PV module.

It is an additional objective of the invention to provide a PV system which records at an early stage failure, loss and/or shading of the individual PV modules and makes available position-related data.

The objective of the invention is achieved through the subject matter of the independent claims. The sub-claims involve further developments of the invention.

According to the invention, provision is made for a photovoltaic system, in short PV system, with a multitude of PV modules. Each PV module comprises a multitude of solar cells which are connected between two exterior outlets, so-called ribbons, which protrude from the rear surface of the PV module facing away from the sun. The exterior outlets of each PV module have an electrical contact, respectively, with a so-called junction box which is attached to the rear surface of the respective PV module. At the assembly of the PV system on site, the PV modules are thus the smallest manageable units of the PV generator. Each PV module has an electrical contact with a so-called junction box in order to carry away the current generated by the PV module.

As previously described, with regard to the power lines the PV modules are arranged in a tree structure. For this purpose, the PV system comprises one or several PV generators. When several PV generators are involved, they are depicted as PV arrays. Each PV generator or PV array comprises a multitude of PV strings connected in parallel which, in turn, comprise a multitude of PV modules connected in series.

Accordingly, the PV modules are connected in series to PV strings by means of PV power lines or PV string lines, wherein the electric current generated by the PV modules or PV strings is conducted via the PV power lines or string lines. The PV strings, in turn, are interconnected in parallel with the PV generator or PV array.

Furthermore, the PV system comprises one or several PV inverted rectifiers for converting the DC voltage generated by the PV modules to AC voltage that is suitable for the network, possibly for supplying the public power grid after retransformation has taken place.

In addition, if required each PV module comprises a measuring device for recording at least a momentary power variable, for example, status, voltage, current, power of the respective PV module so that it is possible to record for each individual PV module the power variable, preferably on the DC side.

For example, it is possible to recognize defects in the power routing, as well as installation errors in the power routing of the modules from the total module performance of each string or of the entire system and a comparison with the DC performance present at one or several inverters.

Each PV module has also an individual communication interface in order to connect the PV modules to a communication network on PV module level. Consequently, the PV modules of the PV system are interconnected in the communication network. As a result, each PV module forms a network node of the communication network. By means of the communication network, each PV module now transmits communication messages with module-specific data, for example about the at least one momentary power variable of the respective PV module, to a control or evaluation device. Preferably, the control device is connected with a network coordinator. By means of the data collection and data transmission to the control device on PV module level, i.e., from each PV module separately, the control device is able to evaluate the at least one power variable of each PV module in module-specific manner. Furthermore, it is possible to determine diagnostic data from the measured values so that the function of each individual PV module can be examined centrally.

Because of the fact that relevant power variables (for example, status, power, voltage or current) are recorded on each individual PV module and data or the measured values are transmitted via the communication network, it is possible to analyze, for example, the output of each individual PV module. It is also possible to compare the power variables of individual PV modules with each other. As a result, it is possible to reduce power generation costs of a solar power station and to increase the performance ratio of such systems. For this purpose, the performance ratio $PR=E_{AC}/E_{sol}*\eta_{mod}$ is determined and optimized, wherein $E_{AC}$ represents the power (AC) supplied to the network, $E_{sol}$ the irradiated solar energy and $\eta_{mod}$ the efficiency factor of the PV module.

An analysis of the solar power station on a PV module level makes it possible i) to recognize errors at an early stage, ii) to identify errors more precisely, iii) to localize errors more precisely, iv) to plan maintenance at an early stage and, consequently, v) to reduce downtimes.

It proved to be especially advantageous when communication networks are designed as a self-organizing network (without previously determined allocations of communication paths) wherein the PV modules independently network with other, typically adjacent, PV modules. Accordingly, the coordination of the communication in the network takes place in a self-organizing manner. The self-organizing communication network does not require previously determined allocations of communication paths, for example, between the network coordinator and a specific PV module. Consequently, the self-organizing communication network does not require a fixed network infrastructure. In particular, the interaction of coordinating the channel access and synchronizing the network nodes takes place in a self-organizing manner. For example, the network address of the PV modules is assigned by the communication network in a self-organizing manner. As a result, it is not required to identify the communication modules as such (from the production side) which can be advantageous for mass production of the PV modules.

Moreover, even in the event that one or several network nodes fail, the self-organizing communication network remains fully functional because each network node, i.e., each PV module, networks independently with one or several network nodes in its proximity. As a result, the communication network is able to automatically compensate in an advantageous manner the failure of one or several network nodes. Then the communication network adjusts in a self-organizing manner to the failure of individual network nodes or PV modules and automatically redirects the communication via other network nodes.

Such a self-organizing communication network has the special advantage that the network installations can be performed at relatively low cost, although individual monitoring on a PV module level takes place. For example, it is not absolutely necessary to provide each PV module with an inverted rectifier, although this is not excluded. However, if desired, it is possible to operate with one or several central inverters. Moreover, installation is not difficult and it is possible to avoid extensive initialization. Therefore, it is possible to keep the installation costs for the communication network within reasonable limits, despite the large number (if required >100, >1000 or even >10,000) of PV modules and thus network nodes. The PV system with self-organizing communication network has the special advantage that it is robust toward external interferences. It is even able to manage the total failure of individual or several network nodes which is of special advantage when large solar power stations are involved.

According to a preferred embodiment, the communication network is independent of the PV power lines for the power generated in photovoltaic manner. As a result, the topology of the communication network can be entirely different from the topology of the PV power lines. Because of the requirements in peak-voltage and peak-current of the PV strings and PV generators, the topology of the PV power lines is typically determined beforehand. This allows for a flexible topology of the communication network. It can basically be an advantage for wired and wireless communication networks. The self-organization of the communication network does not require a predefined fixed structure of the communication network which an assembler would have to take into consideration when installing the PV module. Consequently, an assembler can assemble the PV modules according to a predetermined plan of power routing (PV power lines and/or PV string performance) and connect the power routing between the PV modules without having to take into consideration any structure of the communication network, i.e., independent of the communication network. If, after assembling and connecting the power routing, the communication network is established in a self-organized manner, it is possible to examine via the communication network whether the power routing has been correctly performed by making a comparison between a pre-calculated target output and the actual performance based on known conditions of solar radiation.

In a special type of embodiment, it is possible to combine active and passive network nodes.

It is especially preferred when the self-organizing network is designed as a radio network. In particular, the radio network is designed as an interconnected network (mesh network). In the mesh network, the multitude of PV modules is networked in a mesh structure. In the process, the data is transmitted from PV module to PV module until they reach the control device. Thus in the meshed communication network communication flows in an automatic and dynamic way across the entire PV system. At the same time, the communication paths in the meshed network are not predetermined by a fixed structure/design but find themselves and can also find new paths when there are interferences in the existing paths. In a meshed radio network it is therefore possible to compensate the failure of individual communication or transmission paths by reorganizing the communication paths between the individual PV modules. Consequently, it is preferred to design the communication network as a dynamic, self-organizing, decentrally controlled radio system. For example, for the invention-based PV system it is possible to use wireless transmission systems according to IEEE 802.15.4, TSMP (Time Synchronized Meshed Protocol), ZigBee or Wireless Hart. It is also possible to use GSM or GPRS systems from the domain of telecommunications, for example, limited to decentralized information hubs (for example, with subordinate mesh network). If required, several of the network nodes are arranged in such a way that they can be addressed by an external radio command integrated, for example, in the PV array box even when there is no voltage. It is also possible to provide several mesh networks in a cluster and to use each mesh network of the cluster as part of the backbone.

According to a preferred type of embodiment, the communication network allows the respective PV modules of the PV system to be automatically localized. For example, the meshed radio network comprises means for measuring the distance between the network nodes or PV modules so that each respective distance between the PV modules can be measured and the distance data measured can be transmitted to the control device via the radio network. Preferably, when a fixed reference point has been predetermined, an additional distance measurement is performed between at least one of the network nodes and the previously determined fixed reference point. By means of the distance data received, the control device then prepares an actual-position chart of the actual PV modules in the network, especially with the addresses of the respective PV modules assigned in self-organizing manner. Consequently, the control device can assign the at least one recorded power variable of each PV module to the actual position of the respective PV module determined, resulting in a local allocation of the at least one power variable for each PV module in the PV generator. As a result, the communication network can determine at which point of the PV generator a PV module, for example, is shaded, failed or has been lost, especially without requiring that the PV modules have to be identifiable from the start.

Preferably, the PV system or the control device determines, especially by means of the distance measurement, an actual-position chart of the actual positions of the PV modules and adjusts the actual-position chart with a layout model. For this purpose, the PV system or control device comprises a memory with the stored layout model of the local target positions of all PV modules in the PV generator. The PV system or the control device is then able to assign the at least one respectively determined power variable of the actual PV module to a respective PV module position in the layout model. This layout-adjustment is also described as "locking" the actual-position chart in the layout model. In this way, it can be determined even more precisely which PV module is possibly shaded, failed or has been lost or otherwise interrupted. Furthermore, preferably a reference PV module is specified which is used as reference point for locking the actual-position chart in the layout model. Consequently, a (virtual) reference PV module is specified in the layout model (for example, at the right upper corner of the layout model) and the associated actual PV module is identified in the actual PV system (actual reference PV module in the right upper corner of the PV generator). Then the allocation of the actual reference PV module on the virtual reference PV module is used as reference point for locking the actual-position chart in the layout model. The identification of the actual reference PV module associated with the virtual PV module can be determined manually, for example, by operating a respective switch at the PV module, assigning to the layout model via a control unit or a software component or by having a plug inserted by the assembler. However, it is also possible to provide the reference PV module with a device for absolutely determining the actual location, for example, a satellite receiver (for example, GPS or Galileo). In this case, via the communication network, the reference PV module transmits is absolute positioning information to the control device so that the absolute positioning information is used as reference or "anchor point" for determining the absolute positions of the other PV modules. In both cases, the PV system or the network "knows" the absolutely real position of the actual reference PV module. The absolute position of the other PV modules is then determined by means of the absolute position of the reference PV module and the distance values measured between the PV modules in the network.

It is practical to record as the at least one power variable of each PV module the momentary status, the momentary performance, the momentary voltage and/or the momentary current and to transmit it to the control device via the communication network and to analyze it there centrally.

According to a general embodiment of the invention, data transmission can be performed also via a self-organizing wired communication network. For this purpose, data can be transmitted even via the power lines. In this case, the communication network impresses the signals on the power lines of the PV modules and transmits them to the control device. This method is especially advantageous when the PV modules are provided with an inverted rectifier. In this case, the information can be transmitted via the AC power supply of the PV system. It is possible to use transmission system such as digitalSTROM or PowerLine.

In another advantageous embodiment of the invention, the PV modules can comprise, respectively, a sensor for recording at least one ambient parameter, for example, module temperature, ambient temperature, solar radiation, wind force and/or wind direction, and transmit via the communication network at least one ambient parameter in addition to the at least one power variable to the control device. Consequently, it is possible to perform detailed monitoring and maintenance, if required even control of the PV system, especially in the context of the positioning information of the PV module where the respective data originates.

Furthermore, it is advantageous to transmit manufacturer-specific data via the communication network and to assign the data to the respective PV module. Manufacturer-specific data involves, for example, performance data, module type, if required identification number, serial number, version number, etc. The control device which is typically implemented by a central computer assigns these manufacturer-specific data to the target PV module positions in the layout model.

In an advantageous manner, the invention is able to optimize the performance to the PV module level. Furthermore, it is possible to implement a precise maintenance and repair plan which even supports different module types.

It is practical to integrate the measuring device with a sensor for recording the at least one power variable and/or the communication interface directly in the junction box for the exterior outlets, the so-called ribbons, located at the rear surface of the respective PV module so that no additional external components have to be attached to the PV modules. Preferably, the network coordinator and the control device are integrated in the PV generator combiner box of the PV generator.

According to a preferred embodiment of the invention, the momentary voltage of the PV module is recorded as the at least one power variable by means of a non-linear effect without reference voltage. For example, this can take place by means of a capacitor with field strength dependent capacity, for example, also in the junction box, in which the capacity is a measure for the momentary voltage. The capacitor can form the part of the oscillating circuit and the resonant frequency of the oscillating circuit is determined as measure for the PV module voltage of each PV module. It is practical when the measuring device for recording the at least one power variable and/or the network interface of the PV module is directly supplied with energy by the respective PV module (i.e., with the solar energy generated in photovoltaic manner by the respective PV module). Consequently, it is possible in an advantageous manner to omit an additional power supply for the measuring device for recording the at least one power variable and/or the network interface. In order to be able to maintain for a certain period of time the data communication via the communication network in case of a failure of the PV module, the PV modules preferably comprise energy storage, for example, a rechargeable battery buffer which is charged by the respective PV module and which is used at least for supplying the network interface, if required also for supplying the measuring device for recording the at least one power variable in the respective PV module. As a result, it is possible at any time to monitor the PV module, even in case of a lack of solar radiation, for example, at night. For this purpose, the PV modules are especially able to signal periodically the power variable, etc, via the network. Alternatively, the supply can be performed also by means of an energy recovery from the power wiring.

Subsequently, the invention is explained in more detail by means of the embodiments and in reference to the figures. Identical or similar elements are provided partly with the same reference numerals and the characteristics of the different embodiments can be combined with one another.

BRIEF DESCRIPTION OF THE FIGURES

It is shown.

DETAILED DESCRIPTION OF THE INVENTION

The PV system 1 shown in FIG. 1 comprises a multitude of PV modules 12 of which several PV modules 12 are connected in series to form PV strings. Each PV module 12 comprises on its rear surface a junction box (not shown) having connecting terminals for electric wiring and comprises optionally a respective bypass diode 14, which is typically located in the junction box. The PV strings 22 are connected in parallel via PV string lines 24 and, if required, comprise over-current protection devices 26 and blocking diodes 28. Consequently, the PV modules 12 in this embodiment interconnected in series and in parallel form a PV generator 32. Via a PV direct current line and a separator 36, the interconnected PV modules 12 supply their electrical power to a PV inverted rectifier 42 which converts the direct voltage generated by the PV modules into AC voltage that can be fed into the public power grid. The PV inverted rectifier 42 is installed in a housing of the so-called switchgear assembly 48. An optional transformer 44 in the switchgear assembly 48 transforms the voltage in accordance with the power supply system to be supplied, making it possible to connect the PV system with the public power grid. By means of the DC-sided separator 36 and an AC-sided separator 46, the PV inverted rectifier 42 can be separated from live parts, for example, for the purpose of performing maintenance measures. To the PV generator 32 a PV generator combiner box 38 is assigned in which optionally blocking diodes 28, as well as the parallel circuit combining points 30 of the PV strings 22 have been arranged.

FIG. 2 shows a PV system 1' similar to the one shown in FIG. 1, wherein several PV arrays 31 are interconnected to a PV generator 32'. Also in this case, a multitude of PV modules 12 in each PV array 31 are connected in series to form PV strings 22. To each PV array 31 a PV array combiner box 37 is assigned in which the PV strings 22 are interconnected in parallel at the parallel circuit combining points 30. Via PV array current lines 52, the PV array combiner boxes 37 are connected with a PV generator combiner box 38' in which the PV arrays 31 are interconnected. Via the PV direct current main line 34', the PV generator combiner box 38' is connected with the PV inverted rectifier 42 in the housing of the switchgear assembly. Incidentally, the PV system 1' is designed similar to the PV system 1. Experts are familiar with the basic structure of such PV systems 1, 1' and the present invention is based on these PV systems.

Figure 3:
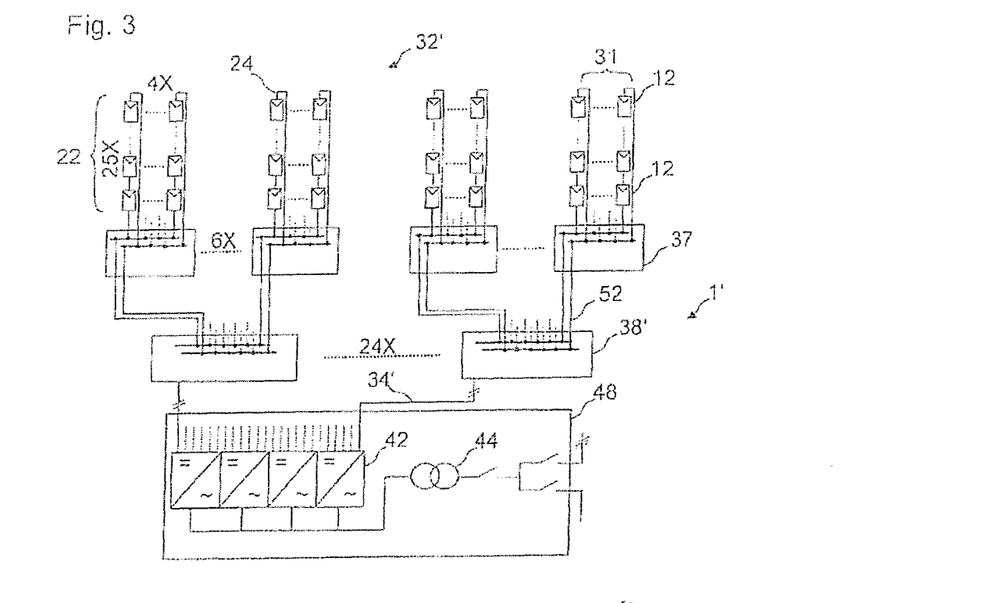

FIG. 3 shows an exemplary structural design of a PV system 1' with several PV arrays according to FIG. 2 having a performance of 2.88 MW$_p$. FIG. 3 shows only sections of the PV modules 12, the PV strings 22, the PV array combiner boxes 37 and PV generator combiner boxes 38'. The exemplary PV modules 12 shown here should comprise a nominal power of 200 WP, a MPP voltage (@STC) of 25 volts and an MPP current (@STC) of 8 amps. In each PV module 12, a respective number of photovoltaic solar cells have been interconnected in order to achieve the performance data mentioned.

The structural design of the PV systems 1' shown in this embodiment comprises 14,400 PV modules 12, wherein 25 PV modules, respectively, per PV string (equal number of modules for each string) are connected in series so that each string has a DC string nominal voltage of 625 volts. The PV modules 12 are indistinguishable and not individualized or identified. Furthermore, 4 PV strings 22 per PV array 31 are here combined in an array combiner box 37 and 6 of these are connected and interconnected in a PV generator combiner box 38'. The 24 PV generator combiner boxes 38' are connected via a mutual DC bar with one or several PV central inverter 42 located, for example, in a PV container 48. The PV inverted rectifiers in a power range of up to 1000 kVA can be connected, for example, in dynamic master-slave-slave-slave (MSSS) configuration. In large PV power stations, the PV alternating voltage is transformed with the transformer 44 to the 20 kV level of a medium voltage network.

Figure 4:
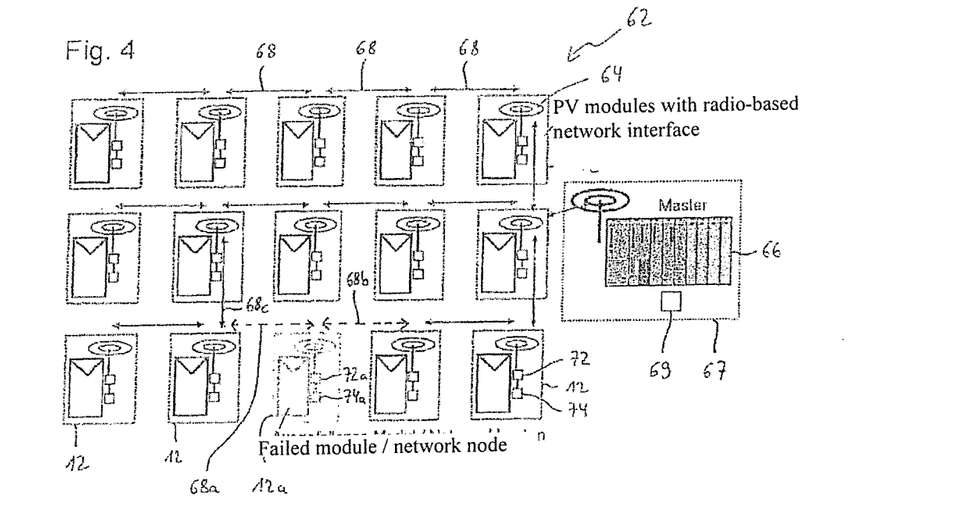

According to the invention, the PV modules of the PV system 1, 1' are now connected and networked with each other to form a network 62. The network 62 can be wired or wireless and is designed to function as a self-organizing network wherein failures of individual network nodes 64 are automatically compensated by the self-organizing network 62. For example, in FIG. 4 it is shown that 15 PV modules 12 are connected to form a meshed self-organizing network 62. A meshed network 62 has the advantage that the range of the individual transmission paths can be relatively short independent of the size of the PV system 1, 1'. Furthermore, the network 62 comprises a control device 67 with a network coordinator 66 which provides the data transmitted via the communication network 62 for further processing and analyzing, as well as a data memory 69. Each PV module 12 comprises a network interface 72, which is in this embodiment wireless, and a measuring device 74 for recording power variables, for example, status, power, voltage, current. Via the communication network 62, the power variables recorded by means of the measuring device 74 are transmitted to network coordinator 66. It is obvious that in the exemplary radio network 62 shown here the network connections 68 for transmitting the communication data are independent from the PV power lines 24, 34, 34', 52. This has the advantage that the electric wiring 24, 34, 34', 52 of the PV system is constructed and connected according to an optimized structural design for photovoltaic power provision, without having to take into consideration the communication network. Even when using a wired communication network 62, the network lines can be installed independent from the electric power wiring. At the same time, it is not necessary in a self-organizing network 62 to maintain a predetermined network structure, although principally this is not excluded. Furthermore, in the embodiment shown in FIG. 4, initially the communication network 62 which has communication connections 68 between the individual PV modules is self-organizing, thus forming the communication connections 68. If, as depicted in the embodiment shown in FIG. 4, a specific PV module 12a or its network interface 72a fails, the network connections 68a, 68b connected with the network module 12a that failed are automatically compensated through other network connections, in this example 68c.

Figure 5:
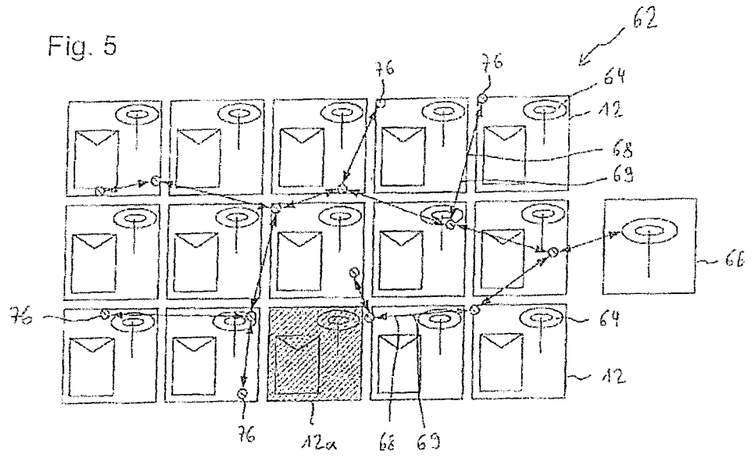
Figure 6:
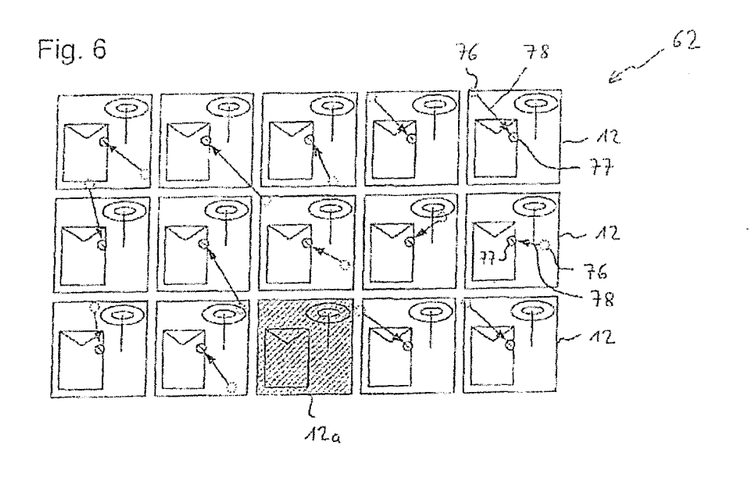

In FIG. 5 the arrows represent the distance measurement by means of the communication connections so that in FIG. 5 the points 76 represent the measured positions of the PV modules 12. In FIG. 6, in line with the assignment algorithm, the measured positions 76 are assigned to the target positions 77 in the layout model of the PV system 1, 1' which is represented by the arrows 78.

In this embodiment of the network, the signals of the measuring devices 74 are analyzed via the radio connections 68 to the effect that a distance between the individual PV modules 12 is determined. Preferably, the network coordinator 66 of the network is here integrated in the PV array combiner box 37 (in a PV system according to FIG. 1 in the PV generator combiner box) and has an open transmission path 68 to more than one, at least two PV modules 12. Then, the measuring results are compared with the mechanical layout model of the PV system 1, 1' stored in the memory 69 of the control device 67. As a result, the measuring signals and possible positions can be adjusted and particularly assigned (so-called "locking" the measured positions with the model positions). Consequently, clear allocations can be obtained even when interferences or obstructions in one or several transmission paths result in inaccurate measurements. For example, for this purpose, it is possible to use algorithms of square error minimization. In this model, positions 12a not "filled" with feedback signals suggest a total failure or loss of the PV module 12a belonging to that place. According to the invention, both the operating condition and presence of each module can be specifically monitored.

In an advantageous manner, it is possible by means of the communication network 62 and the target layout or layout model of the PV system to determine at which place in the PV system, which as shown above can comprise tens of thousands of PV modules, a PV module has failed. Obviously, this considerably alleviates the maintenance of the PV system.

Figure 7:
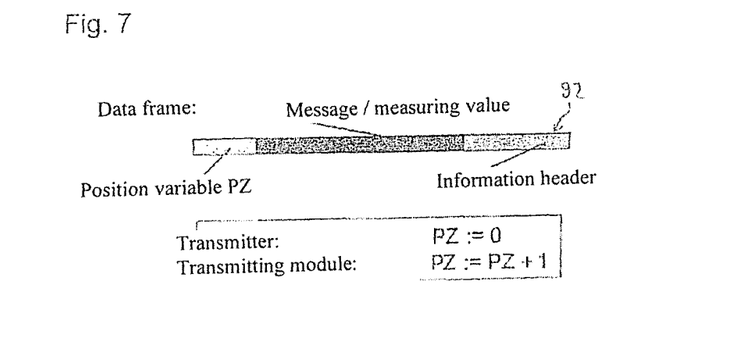

For example, in a wired communication network 62, the localization of the PV modules 12 is possible in that a placeholder (counter) is provided in the communication protocol, which placeholder can be modified by each network node 12 which the information packet passes, without changing the actual information. As shown in FIG. 7, the information is transmitted, for example, in a data frame 92 with a position variable PZ, information which contains the measured value of the at least one power variable and, if required, an information header. For example, the position variable PZ is a counter which is increased by a value (PZ+1) with each passed network node 64. This can take place, for example, in a network which has an integrated network coordinator in the string combiner and thus localizes the transmitting PV module 12 in the form "nth module in the network" and compares it with the wiring of the solar generator without requiring an operator-controlled initialization. If required, it is possible to expand the available signals, for example, GPS or locally implemented radio transmitters for localizing the PV modules.

In a basic embodiment, only a simple value is recorded, for example, "OK" or "not OK" or "PV module available" or PV module not available". In a more extensive embodiment a performance measurement can be carried out and the performance data of each PV module 12 can be transmitted. In a PV system 1, 1' with individual PV strings 22, the terminal voltage present between the two connection lines protruding out of each PV module 12 is measured.

The measuring values are transmitted to the control device 67. In a preferred embodiment, the control device is integrated in the PV array combiner box 37. The measurement of the momentary PV module current can be performed in the PV array combiner box 37 centrally for all PV modules of the associated PV strings 22. The performance of the individual PV modules 12 is determined by means of the control device 67 integrated in the PV array combiner box 37 and, if required, transmitted further. By comparing the PV string voltage and the voltages added up from all PV modules 12 of the respective PV string 22, it is possible to record additional voltage drops at connecting plugs or lines.

Figure 8:
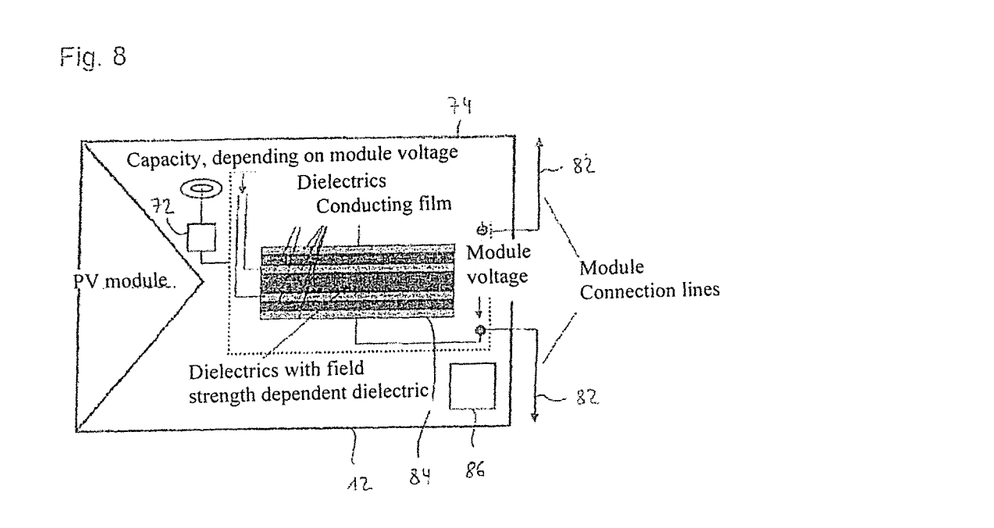

FIG. 8 depicts a PV module 12 which provides the direct current for the module at exterior module connection lines 82, so-called "ribbons". For example, in each PV module 12 a measuring device 74 with a capacitor 84 for recording the power variable is connected in parallel with the module connection lines of the module. Preferably, the monitoring system together with the measuring device 74 or the capacitor 84, as well as the network interface 72 of each PV module 12 is integrated in the associated junction box, which is attached at the respective PV module (see, for example, DE 10 2007 037 130 and DE 10 2007 042 547 by the same applicant). Preferably, the measuring device for recording the at least one power variable and/or the network interface is supplied by the electric energy of the respectively associated PV module generated in photovoltaic manner. For this purpose, it is possible to connect the measuring device for recording the at least one power variable and/or the network interface with the contact device for contacting the ribbons in the junction box (see, for example, DE 10 2007 037 130 and DE 10 2007 042 547 by the same applicant).

In the embodiment shown in FIG. 8, the voltage measurement is performed without reference voltage by using non-linear effects in the electrical field which is generated by the module voltage. Consequently, by using a material with an electric field strength dependent dielectric constant a capacity of the capacitor 84 which depends on the voltage of the module is achievable. This capacity or a change of capacity depending on the voltage of the module can then be analyzed, for example, by means of the resonant frequency formed/adjusted in an oscillating circuit attained with this capacity or the discharge time via a resistance. For example, this occurs through an adjustment with a known frequency (for example, the radio frequency in the network or an integrated quartz crystal). The capacitor 84 can both be part of the DC circuit, into which a high frequency carrier is coupled, and it can be galvanically isolated, in which case the dielectric material is permeated merely by the electric field generated by the respective module.

Via a network the measuring result is transmitted to a local network coordinator. This takes place either cyclically as a data pair consisting of address and voltage value or in acyclic manner when prompted by the network coordinator.

The power supply of the measuring devices 74 or sensors can be performed by means of the PV modules. A respective optional energy storage 86 at the PV modules which is charged by the respective PV module 12 can temporarily perform measurements and transmit information, for example, to the network coordinator even when the module performance decreases. The network coordinator assesses the situation and, if required, introduces measures for action (example: a module signals a power drop, all other functions normal: dusk or cloudiness can be excluded). In this case, the network coordinator 66 signals malfunction of the PV module.

Alternatively, the power supply can take place by means of the radio signal. This signal is sufficient for starting the sensor, performing the measurement and transmitting the measuring value to the network coordinator 66. In prior art further possibilities for self-sufficient power supply have been disclosed under the heading "Energy Harvesting" which can be used also in this case, for example, for utilizing the thermoelectric effect.

Experts know that the embodiments described above are to be viewed merely as examples and the invention is not restricted to them but can be varied in many different ways without leaving the invention. Furthermore, it is obvious that the characteristics define important features of the invention also on an individual basis even if they are described in connection with other characteristics, regardless of whether they are disclosed in the description, the claims, the figures or in any other way.

The invention claimed is:

1. A photovoltaic (PV) system comprising:
   a multitude of PV modules,
   power lines by means of which the PV modules can be connected in series and/or in parallel with a PV generator and by means of which the electric current generated by the PV modules is conducted,
   one or several PV inverted rectifiers for converting the DC voltage generated by the PV modules to AC voltage that can be supplied to the public power grid,
   wherein each of the PV modules has a communication interface and can be interconnected to a communication network so that the individual PV modules form network nodes of the communication network,
   wherein via the communication network communication messages with module-specific data is transmitted from the PV modules to a control device, allowing the control device to assign the module-specific data to the respective PV module,
   wherein the communication network is designed as a self-organizing meshed radio network in which the PV modules are networked with one another in an independent manner and
   wherein the self-organizing meshed radio network comprises means for measuring distance:
   between the network nodes, or
   between the network nodes, and between at least one of the network nodes and a predetermined fixed reference point.

2. A PV system according to claim 1, wherein each of the PV modules has a measuring device for recording at least one power variable, so that the power variable can be recorded individually for each PV module, and the at least one recorded power variable of the respective PV module is transmitted to the control device via the communication network, so that the control device can analyze in a module-specific manner the at least one power variable.

3. A PV system according to claim 1, wherein the communication network automatically compensates the failure of a network node.

4. A PV system according to claim 1, wherein the communication network assigns in self-organizing manner the network address of the PV modules.

5. A PV system according to claim 1, wherein the communication network is independent of the PV power lines for the power generated in photovoltaic manner and the topology of the communication network is different from the topology of the power lines.

6. A PV system according to claim 1, wherein the self-organizing network is designed as a meshed network.

7. A PV system according to claim 1, making it possible to measure, respectively, the actual distance between the network nodes and to transmit the distance data to the control device via the radio network.

8. A PV system according to claim 7, wherein by means of the distance data received an actual-position chart of the actual PV modules is prepared in the network, which comprises the addresses of the respective PV modules assigned in self-organizing manner, and the module-specific data, in particular the at least one recorded power variable of the respective PV module, is assigned to the actual position of the respective PV module determined, resulting in a local allocation of the module-specific data, in particular the at least one power variable for each PV module in the PV generator.

9. A PV system according to claim 1, wherein a memory with a stored layout model of the local target positions of the PV modules is contained in the PV generator, wherein an actual-position chart of the actual positions of the PV modules is determined and the actual-position chart is adjusted to the layout model, and wherein the module-specific data, in particular the at least respectively recorded power variable of the actual PV modules is assigned, respectively, to a PV module position in the layout model.

10. A PV system according to claim 1, wherein at least one of the PV modules is designed as a reference PV module, wherein the actual absolute position of the reference PV module can be retrieved by the control device and can be used as a reference point for determining the position of the remaining PV modules.

11. A PV system according to claim 1, wherein the at least one power variable is the momentary status, the momentary performance, the momentary voltage or the momentary current of the respective PV module.

12. A PV system according to claim 1, wherein a device for detecting defects is incorporated which recognizes defects in the power routing or errors in the installation of the power routing from the total module performance of each string or of the entire system and a comparison with the DC performance present at one or several inverters.

13. A PV system according to claim 1, wherein the PV modules each comprise a sensor for recording at least an ambient parameter, in particular module temperature, ambient temperature, solar radiation, wind force or wind direction, and the at least one ambient parameter is transmitted in addition to the at least one power variable to the control device via the communication network.

14. A PV system according to claim 1, wherein the measuring device for the at least one power variable and/or the communication interface is integrated in the junction box for the exterior connections at the rear surface of the associated PV module.

15. A PV system according to claim 1, wherein the network coordinator of the communication network is integrated in the PV generator combiner box or in the PV array combiner box of the PV generator.

16. A PV system according to claim 1, wherein the at least one power variable is the momentary voltage of the PV module and the momentary voltage is recorded by means of a non-linear effect without reference voltage.

17. A PV system according to claim 16, wherein the measuring device for recording the momentary voltage comprises a capacitor with field strength dependent capacity, so that the capacity of the capacitor is a measurement for the momentary voltage.

18. A PV system according to claim 17, wherein the capacitor is part of an oscillating circuit and the resonant frequency of the oscillating circuit is determined.

19. A PV system according to claim 1, wherein the measuring device for recording the at least one power variable and/or the network interface are supplied directly by the associated PV module with energy generated in photovoltaic manner by this PV module.

20. A PV system according to claim 1, wherein each of the PV modules has an energy storage which allows for a certain period of time for the data communication via the communication network in case of a failure of the PV module.

21. A PV system according to claim 1, wherein coordination of communication in the network takes place in a self-organizing manner.

22. A PV system according to claim 1, wherein the PV modules are indistinguishable and not individualized.

23. A PV system according to claim 1, wherein each of the PV modules does not require its own inverted rectifier.

24. A PV system according to claim 1, wherein each PV module is installable at any position of the PV generator without regard to identification of the PV module.

* * * * *